United States Patent [19]

Katakura

[11] 4,288,707
[45] Sep. 8, 1981

[54] ELECTRICALLY VARIABLE IMPEDANCE CIRCUIT

[75] Inventor: Masayuki Katakura, Yokohama, Japan

[73] Assignee: Tokyo Shibaura Denki Kabushiki Kaisha, Japan

[21] Appl. No.: 18,665

[22] Filed: Mar. 8, 1979

[30] Foreign Application Priority Data

| Mar. 14, 1978 | [JP] | Japan | 53-28283 |
| Nov. 9, 1978 | [JP] | Japan | 53-138243 |
| Nov. 9, 1978 | [JP] | Japan | 53-138246 |

[51] Int. Cl.³ ............................................. H03H 11/00
[52] U.S. Cl. ................................ 307/264; 307/296 A; 307/493; 330/257; 330/284
[58] Field of Search ............... 307/229, 237, 264, 296; 330/254, 257, 284

[56] References Cited

U.S. PATENT DOCUMENTS

| 3,676,789 | 7/1972 | Bray | 330/254 |
| 3,761,741 | 9/1973 | Hoeft | 307/237 |
| 4,066,914 | 1/1978 | Gundry | 307/264 X |

*Primary Examiner*—John Zazworsky
*Attorney, Agent, or Firm*—Finnegan, Henderson, Farabow, Garrett & Dunner

[57] ABSTRACT

An electrically variable impedance circuit in which a voltage-current converter circuit is provided to produce a current having a magnitude corresponding to an instantaneous input signal potential applied to an input terminal and a current variation of the voltage-current converter circuit is fed back to the input terminal, the current variation being controlled by a control signal to vary the circuit impedance seen from the input terminal. In order to expand the range of linearity in impedance, the voltage-current converter is so arranged that the varying component of its output current is linearly proportional to the instantaneous input signal potential, and a current converter circuit is provided which linearly converts the output current of the voltage-current converter circuit and whose output is coupled to the input terminal. The current converter circuit is comprised of a PN junction which develops a voltage which is the logarithm of the output current of the voltage-current converter and a transistor between the base and emitter of which is applied the voltage developed by the PN junction to produce a current which is the exponential of the voltage developed by the PN junction.

10 Claims, 11 Drawing Figures

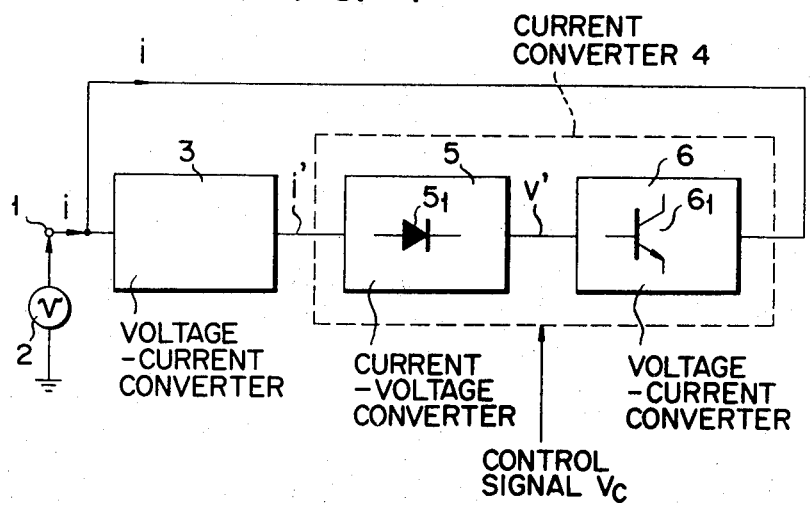
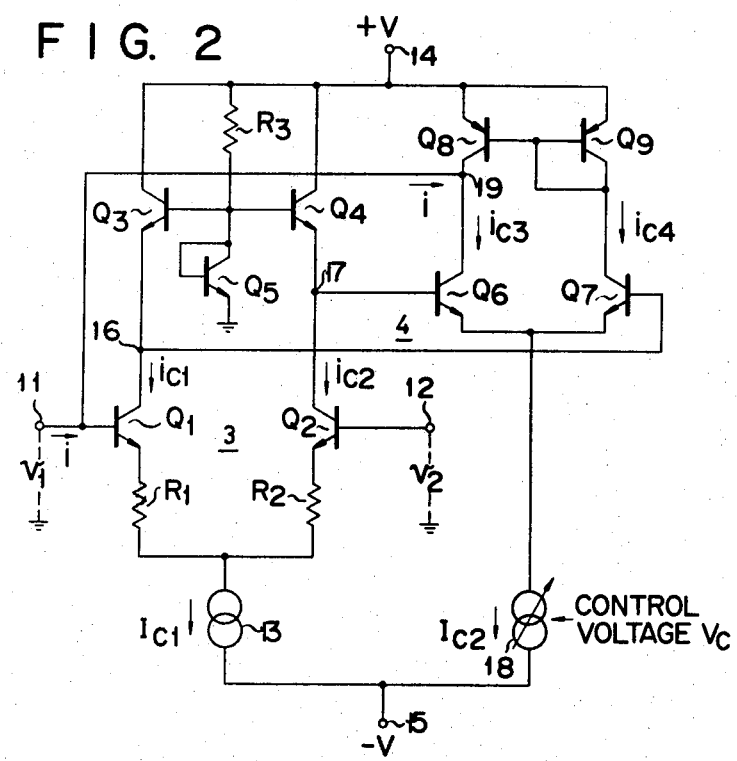

ELECTRICALLY VARIABLE IMPEDANCE CIRCUIT

This invention relates to an electrically variable impedance circuit in which a voltage-current converter circuit connected to an input terminal converts an instantaneous input signal voltage into an output current and the output current is fed back to the input terminal through a feedback loop.

Electrical variable impedance circuits are used in, for example, automatic gain control (AGC) circuits, gain control circuits or frequency characteristic control circuits in multichannel systems, noise reduction circuits, etc. In general, a variable impedance circuit may be embodied by a field-effect transistor. Alternatively, it may be formed of a transistor or diode when the requirement for linearity is not so strict. It is difficult to use a circuit having discrete components as a monolithic integrated circuit configuration because of restrictions on integrable elements and circuits.

An electrically variable impedance circuit suited to monolithic integrated circuits and including a voltage-current converter in which variation of an output current is fed back to one input terminal is disclosed in U.S. Pat. No. 3,761,741 issued to H. Hoeft on Sept. 25, 1973. In this prior art circuit arrangement, the voltage-current converter circuit is comprised of first and second transistors whose emitters are directly coupled to each other and a constant current source connected to the common-coupled emitters, the bases of first and second transistors being coupled to first and second input terminals of the voltage-current converter circuit, respectively. In this circuit, the first input terminal is supplied with an input signal, whereas the second input terminal is grounded. Therefore, the impedance between the first input terminal and ground is controlled. According to an embodiment shown in FIG. 3 of the aforesaid U.S. Patent, the collectors of first annd second transistors or first and second output terminals of the voltage-current converter circuit are connected with a current mirror circuit consisting of a third transistor and a diode-connected fourth transistor. The collector of the first transistor whose base is supplied with the input signal is connected to the third transistor. Further, in order to couple variation in output current to the first input terminal, the first transistor has its collector coupled to its base or the first input terminal. The impedance between the first input terminal and ground is varied by controlling a control current Ic of the constant current source by means of an externally applied control voltage.

In such electrically variable impedance circuit as described above, an instantaneous input current i at an input terminal to which an input signal v is applied may be given as follows:

$$i = 2Ic \frac{\exp(v/VT) - 1}{\exp(v/VT) + 1} \quad (1)$$

where $VT = kT/e$, k is the Boltzmann's constant, e is an electron charge, and T is an absolute temperature (Kelvins).

A conductance Go of this circuit for a small signal may be given by $$Go = \frac{di}{dv}\bigg/_{v=0} = \frac{Ic}{VT} \quad (2)$$

Thus, it will be understood that the small-signal conductance Go is in proportion to the control current Ic of the constant current source. Such proportional relationship covers a wide range of the control current Ic. Accordingly, this type of circuit is highly practical for a monolithic integrated circuit, since it basically employs a differential amplifier circuit configuration.

This prior art circuit, however, is often limited in application due to the following disadvantages. Firstly, as may be seen from eq. (2), the circuit exhibits relatively high temperature-dependence. Secondly, the range of linearity of the conductance to the change of the input signal voltage is relatively narrow. This is due to the fact that changes in the collector currents of the differential transistors are not proportional to the input signal voltage v because the emitters of the differential transistors are directly coupled to each other. Consequently, the prior art circuit cannot meet the wide-range linearity required of audio circuits for a dynamic range. Although the range of linearity may be extended N times by providing N−1 series-connected diodes for the emitter of each differential transistor, an increase of the number N would increase the chip area. In practice, N may be limited to five at most.

It is an object of this invention to provide an electrically variable impedance circuit having an expanded range of linearity in impedance and suitable for a monolithic integrated circuit version.

According to this invention, a voltage-current converter circuit connected to an input terminal is so arranged as to produce an output current linear with an instantaneous input signal voltage applied to the input terminal and a current converter circuit is provided for linearly converting the output current of the voltage-current converter circuit into an output current of the current converter circuit which is fed back to the input terminal.

In order to vary the circuit impedance seen from the input terminal the current fed from the current converter circuit back to the input terminal is controlled by a control signal. The current converter circuit includes a PN junction connected to receive the output current of the voltage-current converter to convert the output current of the voltage-current converter into a voltage which is the logarithm of the output current of the voltage-current converter and a transistor connected to receive between the base and emitter thereof the voltage converted by the PN junction and produce an output current which is the exponential of the voltage produced by the PN junction.

Advantages provided by this invention are as follows: since the impedance has no dependence on an input signal applied to the input terminal, the range of linearity of the variable impedance is expanded; the impedance has no temperature-dependence; and the variable impedance circuit can be used as a floating variable impedance circuit because the impedance has no dependence on the input signal.

This invention can be more fully understood from the following detailed description when taken in conjunction with the accompanying drawings, in which:

FIG. 1 is a block diagram showing a basic concept of this invention;

FIG. 2 shows an electrically variable impedance circuit according to a first embodiment of this invention;

Figure 4:
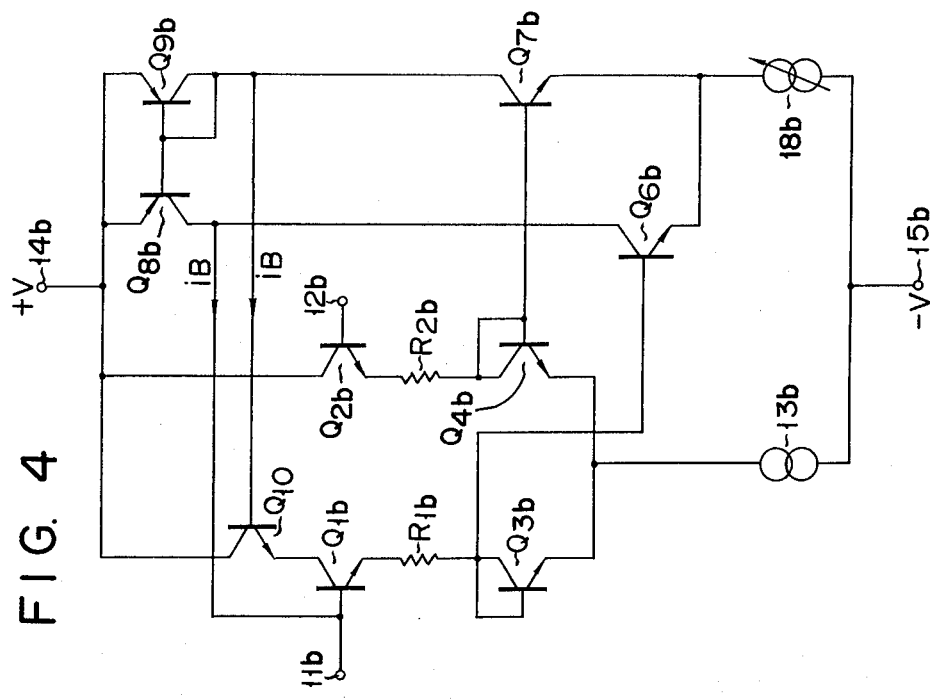
FIG. 4 shows a variable impedance circuit according to a third embodiment of the invention.

In FIG. 1, which shows a basic concept of this invention, to an input terminal 1 are connected an input signal source 2 and a voltage-current converter 3 having a relatively high input impedance. The voltage-current converter 3 may be comprised of, for example, a transistor having its base connected to the input terminal 1 and a resistor connected to the emitter of the transistor to produce an emitter current i' which is linearly proportional to an instantaneous input signal voltage v applied to the input terminal 1. To the voltage-current converter 3 is connected a current converter 4 with a current-voltage converter 5 and a voltage-current converter 6. The current-voltage converter 5 is connected to receive the output current i' of the voltage-current converter circuit 3 and has a PN junction or diode $5_1$ to develop a voltage v' which is the logarithm of the current i'. The voltage-current converter circuit 6 comprises a transistor $6_1$ between the base and emitter of which is applied the nonlinear voltage v' from the current-voltage converter 5 to produce a current i which is the exponential of the voltage v'. Since the nonlinearity of the diode $5_1$ and the nonlinearity of the base-emitter junction of the transistor $6_1$ are cancelled out, the current i' is linearly converted into the current i. The output of the voltage-current converter is fed back to the input terminal 1 so that the current i flows through the input terminal 1. Accordingly, the circuit impedance as seen from the input terminal 1 is given by v/i. If the bias voltage of diode $5_1$ or the gain of transistor 6 is varied by a voltage signal Vc, then the current i may vary independently of the input signal voltage v, whereby the circuit impedance is made variable. According to this invention, since the current i' can be linearly converted into the current i over a wide range, the range of linearity in impedance can be expanded.

Referring now to the drawing of FIG. 2, there is shown a first practical embodiment of this invention, in which the bases of first differential NPN-transistors Q1 and Q2 are connected to first and second input terminals 11 and 12 of a voltage-current converter circuit 3, respectively. The impedance between the input terminals 11 and 12 is controlled. The input terminal 12 may be grounded with the result that the impedance between the terminal 11 and ground is varied. The emitters of differential transistors Q1 and Q2 are connected through feedback resistors R1 and R2, respectively, to one end of a constant current source 13, the other end of which is connected to a negative voltage (−V) supply terminal 15. The matched transistors Q1 and Q2, feedback resistors R1 and R2, and the constant current source 13 constitute the voltage-current converter circuit 3. The collectors of transistors Q1 and Q2, that is, first and second output terminals 16 and 17 of the voltage-current converter circuit 3 are coupled to a positive voltage (+V) supply terminal 14 through a nonlinear load circuit including a PN junction pair. The PN junction pair is formed of base-to-emitter junctions of a pair of NPN-matched transistors Q3 and Q4 whose bases are maintained at a constant potential by a resistor R3 and a diode-connected transistor Q5. More specifically, the transistors Q3 and Q4 have their collectors connected to the power supply terminal 14, their emitters connected to the collectors of transistors Q1 and Q2 respectively, and their bases connected to a junction between the resistor R3 and the diode-connected transistor Q5 which are connected in series between the power supply terminal 14 and ground.

The collectors of transistors Q1 and Q2 are also connected, respectively, to the bases of second differential NPN transistors Q7 and Q6 whose emitters are directly connected with each other. Connected between the commonly connected emitters of transistors Q6 and Q7 and the power supply terminal 15 is variable current source 18 whose current value is controlled by an externally applied control voltage Vc. Connected between the collectors of transistors Q6 and Q7 and the power supply terminal 14 is a current mirror circuit comprised of a pair of PNP transistors Q8 and Q9. More specifically, in the current mirror circuit, the transistors Q8 and Q9 have their emitters connected to the power supply terminal 14, their collectors connected to the collectors of transistors Q6 and Q7, respectively, and their bases directly connected with each other. Moreover, the transistor Q9 is diode-connected with its collector shunted to its base. The PN junction pair Q3 and Q4, differential transistors Q6 and Q7, current source 18, and the current mirror transistors Q8 and Q9 constitute a current converter circuit 4. An output of the current converter circuit 4, i.e. a junction 19 of the transistors Q6 and Q8 in this embodiment, is connected to an input terminal of the voltage-current converter circuit 3, i.e. the first input terminal 11 in this embodiment.

Supposing that constant currents of the current sources 13 and 18 are $I_{C1}$, and $I_{C2}$ respectively, potentials at the input terminals 11 and 12 are v1 and v2, respectively, and the emitter feedback resistors R1 and R2 each have such a value that the D.C. voltage drop thereacross is sufficiently large compared with $V_T(=26$ mV) at room temperature, then collector currents $i_{C1}$ and $i_{C2}$ of the differential transistors Q1 and Q2 which are the output currents of the voltage-current converter circuit 3, may be given as follows:

$$i_{C1} = \tfrac{1}{2}\left(I_{C1} + \frac{v1 - v2}{RE}\right) \qquad (3)$$

$$i_{C2} = \tfrac{1}{2}\left(I_{C1} - \frac{v1 - v2}{RE}\right)$$

where RE=R1=R2.

That is, when the resistors R1 and R2 have a sufficiently large value, the currents $i_{C1}$ and $i_{C2}$ are determined substantially by the resistors R1 and R2 and thus have no dependence on the nonlinear characteristic of the base-emitter junctions of transistors Q1 and Q2. Accordingly, collector currents $i_{C1}$ and $i_{C2}$ of transistors Q1 and Q2 are obtained which vary in proportion to a difference between the input potentials V1 and V2. More specifically, the voltage current converter of FIG. 1 functions to supply the first and second output terminals 16 and 17 with the first and second output currents $i_{C1}$ and $i_{C2}$ varying in opposite directions with respect to the reference current $I_{C1}$ and having variations proportional to the difference between the potentials v1 and v2 at the first and second input terminals 11 and 12.

The base-to-emitter junctions of the transistors Q3 and Q4 serve as nonlinear loads for the collector currents $i_{C1}$ and $i_{C2}$ of the differential transistors Q1 and Q2, respectively. Since the difference between voltage drops across the nonlinear loads caused by the collector currents $i_{C1}$ and $i_{C2}$ is applied between the bases of transistors Q6 and Q7, the nonlinearity between the base-to-emitter voltage and collector current of each of the differential transistors Q6 and Q7 is cancelled out. Accordingly, collector currents $i_{C3}$ and $i_{C4}$ of the transistors Q6 and Q7 and the collector currents ic1 and ic2 of transistors Q1 and Q2 have the following relationship:

$$ic1 \cdot ic4 = ic2 \cdot ic3. \qquad (4)$$

Since $ic1 + ic2 = Ic1$ and $ic3 + ic4 = Ic2$, $$ic3 = ic1 \cdot (Ic2/Ic1)$$

$$ic4 = ic2 \cdot (Ic2/Ic1) \qquad (5)$$

That is, the output currents ic3 and ic4 of the current converter circuit are in proportion to the output currents ic1 and ic2 of the voltage-current converter circuit, respectively.

An input current i introduced through the input terminal 11 is an output current ic3−ic4 of the current mirror circuit.
Hence, $$i = ic3 - ic4 = \frac{Ic2}{Ic1}(ic1 - ic2) = \frac{Ic2}{Ic1} \cdot \frac{v1 - v2}{RE}. \qquad (6)$$

Accordingly, a conductance G between the input terminals 11 and 12 is given by $$G = \frac{i}{v1 - v2} = \frac{1}{RE} \cdot \frac{Ic2}{Ic1}. \qquad (7)$$

The features or advantages of this invention are expressed in eq. (7). Namely:

(1) The impedance between the input terminals is independent of input potentials, so that the range of linearity in impedance may be extended.

(2) The impedance depends on the feedback resistor RE and the ratio of the current Ic1 to Ic2 provided by the two control current sources. In the embodiment of FIG. 2, the current Ic2 of the control current source 18 is changed by the control voltage Vc in order to change the impedance. Alternatively, however, the circuit may be so arranged as to change the current Ic1 of the control current source 13. A change of the ratio of the control current Ic1 to Ic2 means a change of the ratio of the sum of the output currents ic1 and ic2 of the voltage-current converter circuit to the sum of output currents ic3 and ic4 of the current converter circuit.

(3) The temperature-dependence of impedance is eliminated.

(4) Since the impedance has no dependence on the signal potentials at the input terminals 11 and 12, the variable impedance circuit of this invention may be used as a floating variable impedance circuit in which both the input terminals 11 and 12 are floating with respect to ground. The circuit shown in FIG. 2 may be regarded as a variable impedance circuit consisting of a voltage-follower circuit with its input connected to the input terminal 12 and a variable resistive element connected between the output of the voltage-follower and the input terminal 11.

Figure 3:
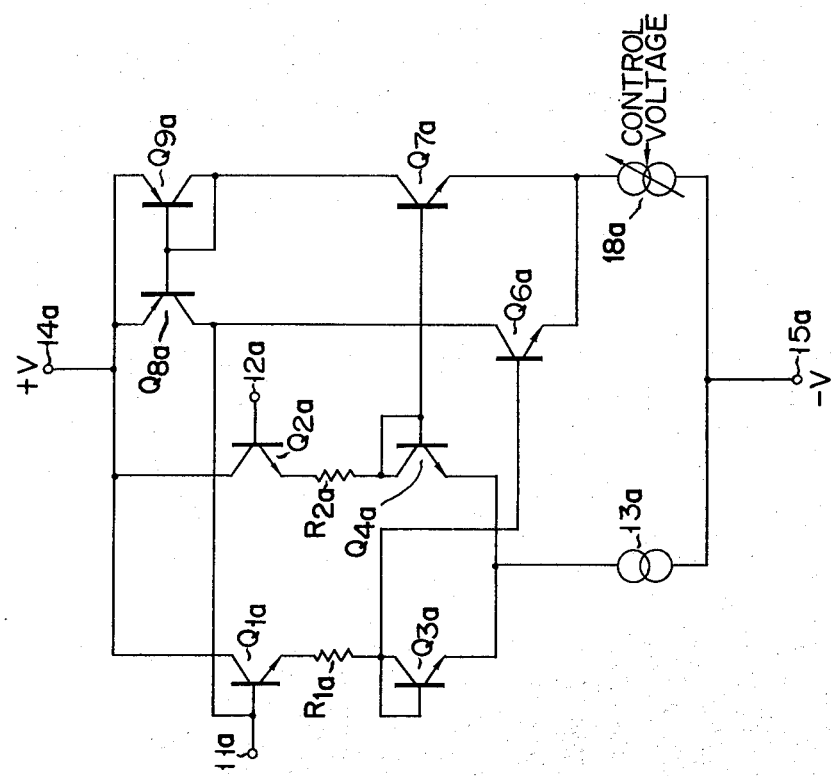
FIG. 3 shows a variable impedance circuit according to a second embodiment of the invention.

Referring now to FIG. 3, there is shown a second embodiment of the invention, in which a PN junction pair is comprised of diode-connected transistors Q3a and Q4a which are provided in the emitter circuits of differential transistors Q1a and Q2a, respectively. Although the circuit of this embodiment is subject to some deterioration in the voltage-current converting capability of the differential transistors Q1a and Q2a, it practically provides substantial advantages as follows. Firstly, whereas in the circuit of FIG. 2 the allowable signal swing between input terminals 11 and 12 is limited to a range from $+V_{BE}$ to $-V_{BE}$ because the DC potentials at the collectors of the transistors Q1 and Q2 are substantially zero, such limit is eliminated in the circuit of FIG. 3. Secondly, the transistors Q1a and Q2a function as an emitter follower, so that a phase shift of an input signal is reduced to perform a stable operation.

In the variable impedance circuit of the aforesaid embodiments, when the control current Ic2 is very small and $V_1 = V_2$, an offset current flows into the base of transistors Q1 and Q1a through the input terminals 11 and 11a. Although Darlington-connected transistors may effectively be used for the transistors Q1, Q1a, Q2, and Q2a in order to reduce the input current i substantially to zero in that state, the simplest and most effective arrangement for this purpose is shown in FIG. 4. That is, the collector-emitter path of a transistor Q10 whose base is connected to the collector of transistor Q9b is connected in series with the transistor Q1b. According to such arrangement, a base current iB flows into the respective bases of the transistors Q1b and Q10 from current mirror transistors Q8b and Q9b. Thus, the current flowing into the base of transistor Q1b through the input terminal 11b may be reduced substantially to zero where v1=v2. Namely, i can be reduced to zero by internally supplying the transistor Q1b with the offset current.

Figure 5:
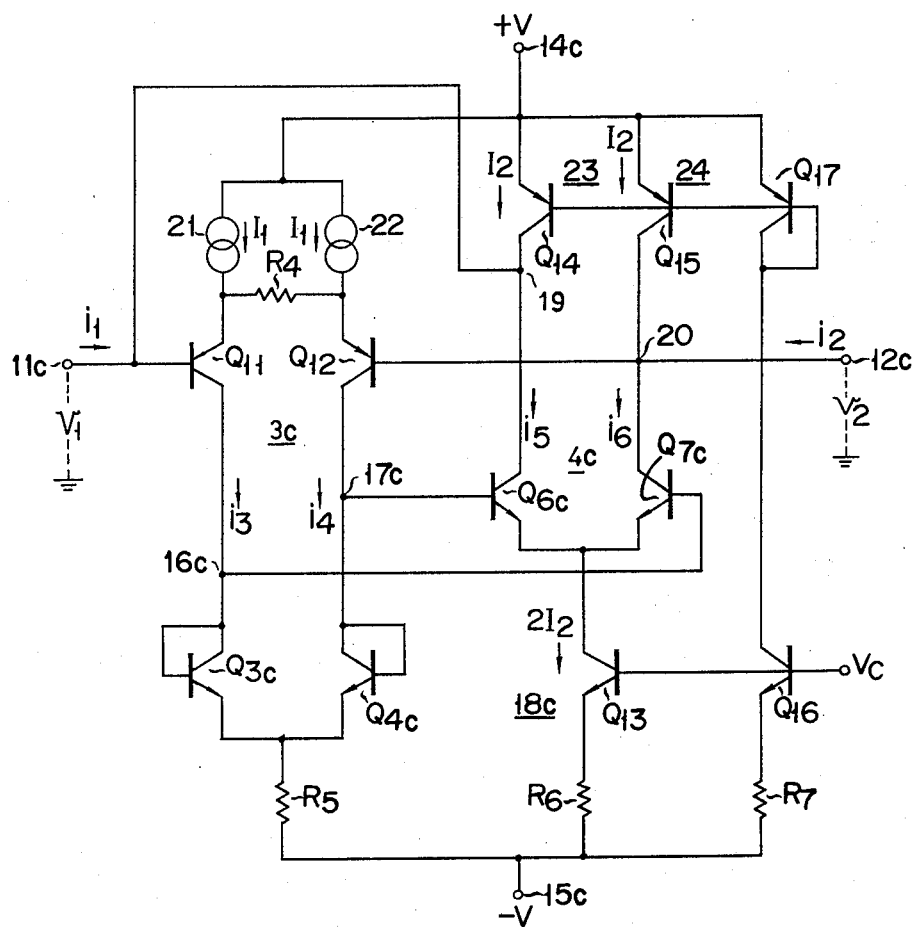
FIG. 5 shows a variable impedance circuit according to a fourth embodiment of the invention.

FIG. 5 shows a variable impedance circuit according to a fourth embodiment, which differs from the above-mentioned embodiments mainly in that current sources are used as loads for second differential transistors Q6c and Q7c instead of using the current mirror, and that both outputs 19 and 20 of current converter circuit are connected respectively to first and second input terminals 11c and 12c of the voltage-current converter circuit 3c.

The voltage-current converter circuit 3c of FIG. 5 is comprised of PNP transistors Q11 and Q12, a resistor R4 connected between the emitters of transistors Q11 and Q12, and constant current sources 21 and 22 connected between the respective emitters of transistors Q11 and Q12 and the power supply terminal 14c. A resistor R5 is connected between the power supply terminal 15c and the commonly connected emitters of the PN junction pair or diode-connected transistors Q3c and Q4c, respectively, receiving output currents of the voltage-current converter circuit 3c.

An NPN transistor Q13 and a resistor R6 constituting the current source 18c are connected in series between the emitters of differential transistors Q6c and Q7c and the power supply terminal 15c. A PNP transistor Q14 forming the current source 23 is connected between the collector of transistor Q6c and the power supply terminal 14c, while a PNP transistor Q15 forming the current source 24 is connected between the collector of transistor Q7c and the power supply terminal 14c. The junction of the transistors Q6c and Q14 or the first output 19 of the current converter circuit 4c is connected to the first input terminal 11c of the voltage-current converter circuit 3c, while the junction of the transistors Q7c and Q15 or the second output 20 of the current converter circuit 14c is connected to the second input terminal 12c of the voltage-current converter circuit 3c. In order to interlock the current sources 23 and 24 with the current source 18c, a PNP transistor Q17, an NPN transistor Q16, and a resistor R7 are connected in series between the power supply terminals 14c and 15c. More specifically, the bases of transistors Q14 and Q15 are connected to the base of transistor Q17, which in turn is connected to the collector of transistor Q17 as well as to the collector of the transistor Q16. The bases of transistors Q13 and Q16 are connected with each other to receive the control voltage Vc. The current of the current sources 23 and 24 may be set at half the current of the current source 18c when values of the resistors R6 and R7 are selected such that 2R6=R7.

Now there will be described operation of the circuit of FIG. 5. If potentials applied to the input terminals 11c and 12c are v1 and v2 respectively, and current provided by the current sources 21 and 22 is I1, output currents i3 and i4 of the voltage-current converter circuit 3c are given as follows:

$$i3 = I1 - k1(v1 - v2),$$

$$i4 = I1 + k1(v1 - v2) \quad (8)$$

where k1 is transfer conductance, which is k1≈1/R4 in the embodiment of FIG. 5. The output currents i3 and i4 flow through the PN junction pair transistors Q3c and Q4c respectively, and the difference between voltage drops across the respective base-to-emitter junctions of transistors Q3c and Q4c is applied between the bases of transistors Q6c and Q7c.

Consequently, output currents of the current converter circuit 4c or collector currents i5 and i6 of the differential transistors Q6c and Q7c are given as follows:

$$i5 = i4 \times (I2/I1) = I2 + (I2/I1)k1 \ (v1 - v2),$$

$$i6 = i3 \times (I2/I1) = I2 - (I2/I1)k1(v1 - v2) \quad (9)$$

where I2 is the current of the current sources 23 and 24.

Currents i1 and i2 flowing respectively into the input terminals 11c and 12c are given by $$i1 = i5 - I2 = (I2/I1)k1(v1 - v2),$$

$$i2 = i6 - I2 = -(I2/I1)k1(v1 - v2) \quad (10)$$

As is evident from eq. (10), $$i1 = -i2 \left( = \frac{i5 - i6}{2} \right).$$

Accordingly, it will be understood that the circuit of FIG. 5 is equivalent to a resistor with conductance equal to k1×I2/I1. Since the current I2 is varied by the control voltage Vc, the circuit of FIG. 5 serves also as a variable impedance circuit. Instead of controlling the current I2, the current I1 may be controlled. In this case, it is desired that a constant voltage element such as a constant voltage diode be used in place of the resistor R5.

If the transistor Q15 is omitted and the input terminal 12c is disconnected from the output terminal 20 of the current converter circuit 4c, the circuit of FIG. 5 will operate in the same manner with the circuit of FIG. 2. Alternatively, the transistor Q14 may be omitted, with the terminal 19 disconnected from the input terminal 11c.

Figure 6:
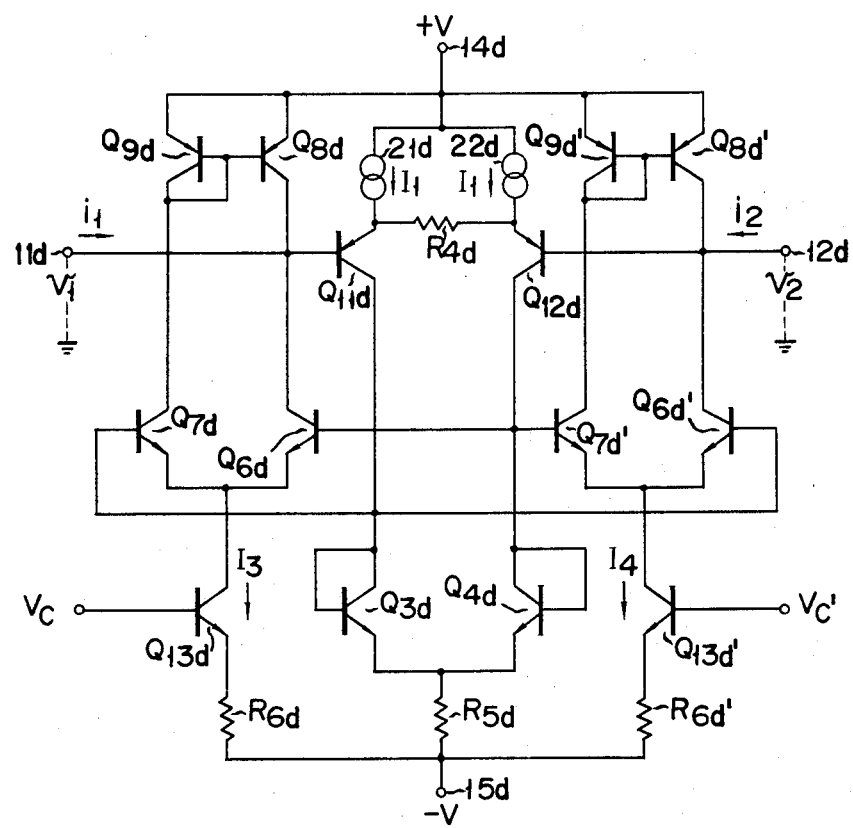
FIG. 6 shows a variable impedance circuit according to a fifth embodiment of the invention.

FIG. 6 shows a fifth embodiment of the invention in which impedances as seen from the input terminals 11d and 12d can be varied independently. The circuit of this embodiment includes two pairs of emitter-coupled differential transistors Q6d, Q7d; and Q6d', Q7d', the bases of the transistors of each pair being connected to the PN junction pair Q3d and Q4d. The commonly connected emitters of differential transistors Q6d and Q7d are connected to the power supply terminal 15d through a series circuit of a transistor Q13d and a resistor R6d which constitutes a current source, while the emitters of differential transistors Q6d' and Q7d' are connected to the power supply terminal 15d through a series circuit of a transistor Q13d' and a resistor R6d'. The collectors of differential transistors of Q6d and Q7d are connected with a current mirror circuit formed of transistors Q8d and Q9d, while the collectors of differential transistors Q6d and Q7d are connected with a current mirror circuit formed of transistors Q8d' and Q9d'. The junction of the transistors Q6d and Q8d is connected to the first input terminal 11d, while the junction of the transistors Q6d' and Q8d' is coupled to the second input terminal 12d. The bases of transistors Q1d and Q13d' are coupled with first and second control voltages Vc and Vc', respectively.

If control currents flowing through the transistors Q13d and Q13d' and I3 and I4 respectively, currents i1 and i2 flowing through the first and second input terminals 11d and 12d are given as follows:

$$i1 = 2(I3/I1)k1(v1 - v2),$$

$$i2 = -2(I4/I1)k1(v1 - v2). \quad (11)$$

Accordingly, in the embodiment of FIG. 6, conductances as seen from the input terminals 11d and 12d are 2k1(I3/I1) and 2k1(I4/I1) respectively. It will be evident that, if I3≠I4, the conductances seen from the two input terminals 11d and 12d are different from each other. Although in the embodiment of FIG. 6 the different current source transistors Q1d and Q1d' are provided for the respective differential transistor pairs Q6d, Q7d; and Q6d', Q7d', a common current source may alternatively be provided for both these transistor pairs. In this case, if the emitter area of the differential transistor pair Q6d and Q7d is made different from that of the pair Q6d' and Q7d', the conductances as seen from the input terminals 11d and 12d will have the ratio between the emitter areas of the two differential transistor pairs.

Figure 7:
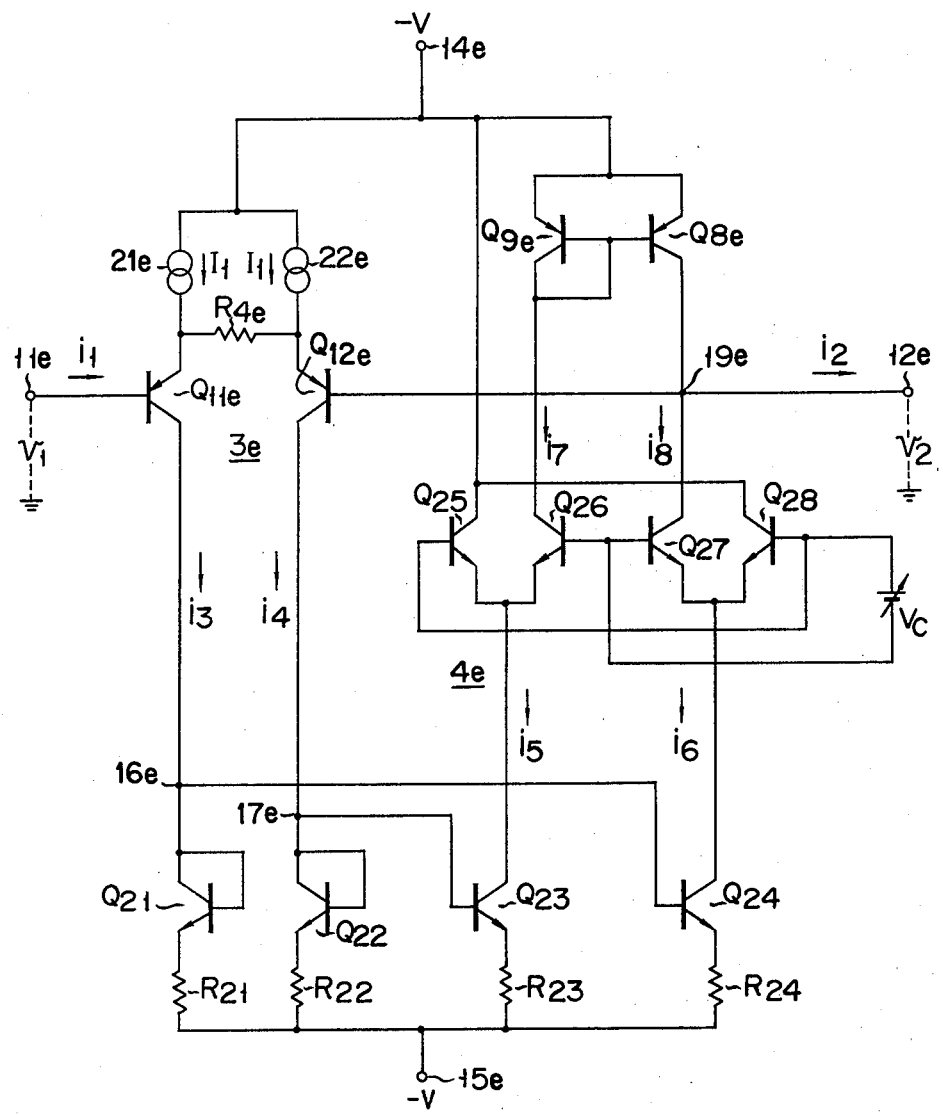
FIG. 7 shows a variable impedance circuit according to a sixth embodiment of the invention.

FIG. 7 shows a sixth embodiment of the invention, which is characterized in that the current converter circuit is composed of a current amplifier circuit and a current divider circuit.

The current amplifier circuit is comprised of NPN transistors Q21 to Q24 and resistors R21 to R24, while the current divider circuit is comprised of NPN transistors Q25 to Q28. More specifically, the diode-connected transistor Q21 and resistor R21 are connected in series between the output terminal 16e of the voltagecurrent converter circuit and the power supply terminal 15e, and the diode-connected transistor Q22 and resistor R22 are connected in series between the output terminal 17e of the voltage-current converter circuit and the power supply terminal 15e. The transistor Q23 has its base connected to the output terminal 17e, its emitter connected to the power supply terminal 15e through the resistor R23 and its collector connected to the emitters of differential transistors Q25 and Q26, whereas the transistor Q24 has its base connected to the output terminal 16e, its emitter connected to the power supply terminal 15e through the resistor R24 and its collector connected to the emitters of differential transistors Q27 and Q28. The collectors of transistors Q25 and Q28 are connected to the power supply terminal 14e, and the collectors of transistors Q26 and Q27 are connected to the collectors of current mirror transistors Q9e and Q8e, respectively. The control voltage Vc is applied between the commonly connected bases of the transistors Q25 and Q28 and the commonly connected bases of the transistors Q26 and Q27. The collector of transistor Q27 is connected to the input terminal 12d of the voltage-current converter circuit.

In general, in the circuit of FIG. 7, $R24/R21 = R23/R22 = k2$. Therefore, output currents i5 and i6 of the current-inverting type current amplifier circuit are given as follows:

$$i5 = k2 \cdot i4 = k2\{I1 + k1(v1 - v2)\}$$

$$i6 = k2 \cdot i3 = k2\{I1 - k1(v1 - v2)\} \quad (12)$$

That is, the output currents i5 and i6 of the current amplifier circuit are proportional to output currents i4 and i3 of the voltage-current converter circuit, respectively. The diode-connected transistors Q21 and Q22 are provided for temperature compensation of transistors Q23 and Q24.

The output currents of the current divider circuit or collector currents i7 and i8 of the transistors Q26 and Q27 are given as follows:

$$i7 = f(Vc)i5 = f(Vc)k2\{I1 + k1(v1 - v2)\}$$

$$i8 = f(Vc)i6 = f(Vc)k2\{I1 - k1(v1 - v2)\} \quad (13)$$

where f(Vc) is the dividing ratio between the collector currents of each differential transistor pair, which is given by $$\frac{1}{1 + \exp(8Vc/kT)}$$

Since the current i7 flows through both the current mirror transistors Q8e and Q9e, the output current i2 is given by $$i2 = i7 - i8 = 2f(Vc) \cdot k1 \cdot k2(v1 - v2) \quad (14)$$

Accordingly, the conductance of the circuit of FIG. 7 is $2f(vc) \cdot k1 \cdot k2$. As is evident from eq. (13), the sum of the output currents i7 and i8 of the current divider circuit is $2f(Vc) \cdot k2 \cdot I1$, and the ratio of this current sum to the sum 2I1 of the output currents i3 and i4 of the voltage-current converter circuit is varied by the control voltage Vc, whereby the impedance of the circuit will be changed.

The current divider circuit of FIG. 7 also functions as a current converter circuit. Namely, the collector currents i5 and i6 of transistors Q23 and Q24 are respectively converted into voltages, which are the logarithm of the currents i5 and i6, by the base-emitter PN junctions of transistors Q25 and Q28. The converted voltages appear at the emitters of transistors Q25 and Q28 and are applied between the base and emitter of the transistor Q26 and between the base and emitter of transistor Q27, respectively. The transistors Q26 and Q27 respectively produce at the collectors thereof the currents i7 and i8 which are the exponential of the applied voltages.

Figure 8:
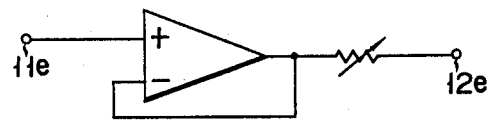
FIG. 8 shows an equivalent circuit of the variable impedance circuit of FIG. 7.

As shown in FIG. 8, the circuit of FIG. 7 may be considered to be formed of a combination of a voltage-follower with a non-inverting input connected to the input terminal 11e and a variable resistor connected between the output of the voltage-follower and the input terminal 12e.

In the embodiment of FIG. 7, the non-linear factor, which would be caused by the possible electrical characteristic difference between the transistors of the PN junction transistor pair and differential transistor pair which should preferably be matched pairs, may be reduced, as compared with the aforementioned embodiments. This is because the current amplification and division can be achieved with satisfactory linearity.

Figure 9:
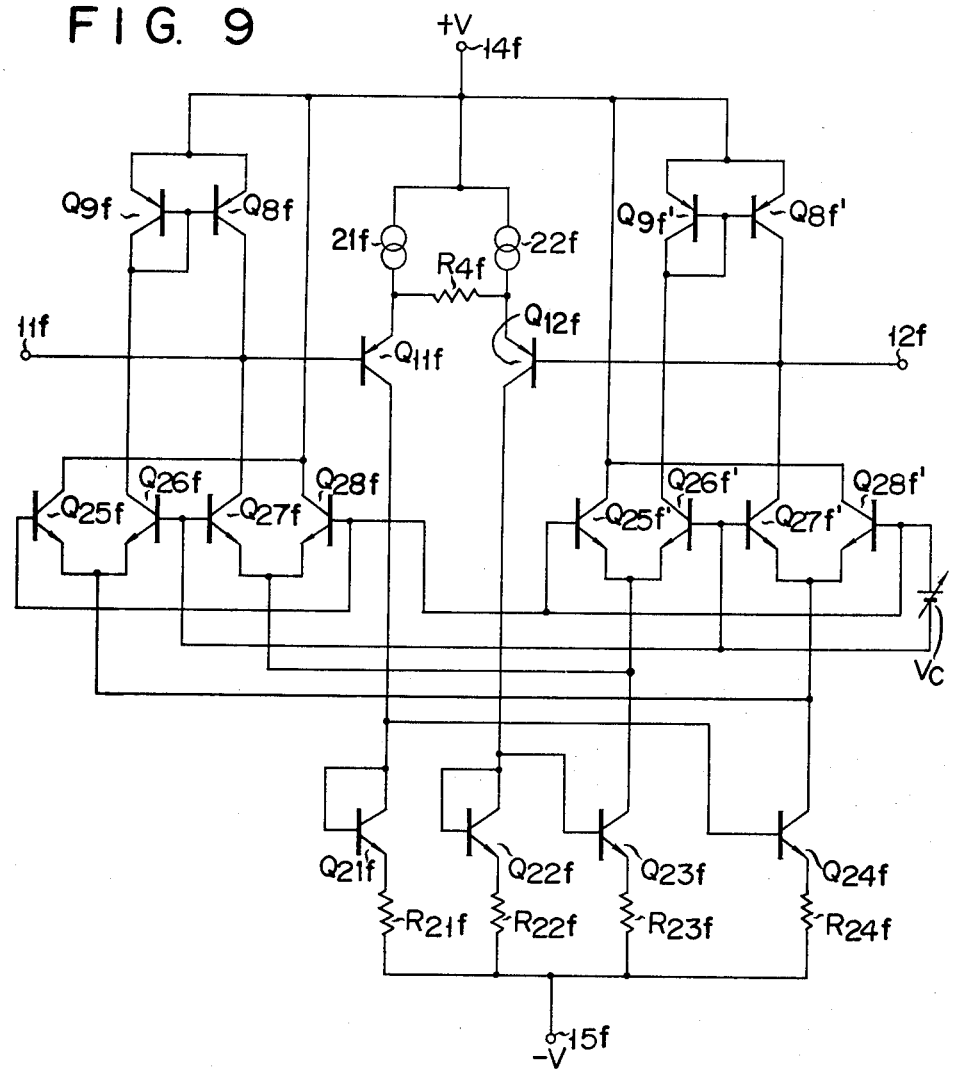
FIG. 9 shows a variable impedance circuit according to a seventh embodiment of the invention.
Figure 10:
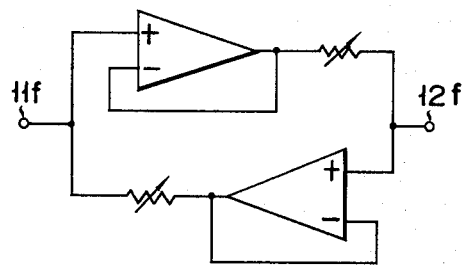
FIG. 10 shows an equivalent circuit of the variable impedance circuit of FIG. 7.

FIG. 9 shows a seventh embodiment of the invention. The circuit of this embodiment includes two sets of current divider circuits comprised respectively of transistors Q25f to Q28f and of Q25f' to Q28f' and controlled by the same control voltage Vc, and two sets of current mirror circuits comprised respectively of transistors Q8f and Q9f and of Q8f' and Q9f'. The junction of the transistors Q27f and Q8f is connected to the input terminal 11f, while the junction of the transistors Q27f' and Q8f' is connected to the input terminal 12f. The circuit of FIG. 9 may be regarded as such a variable impedance circuit as shown in FIG. 10.

Figure 11:
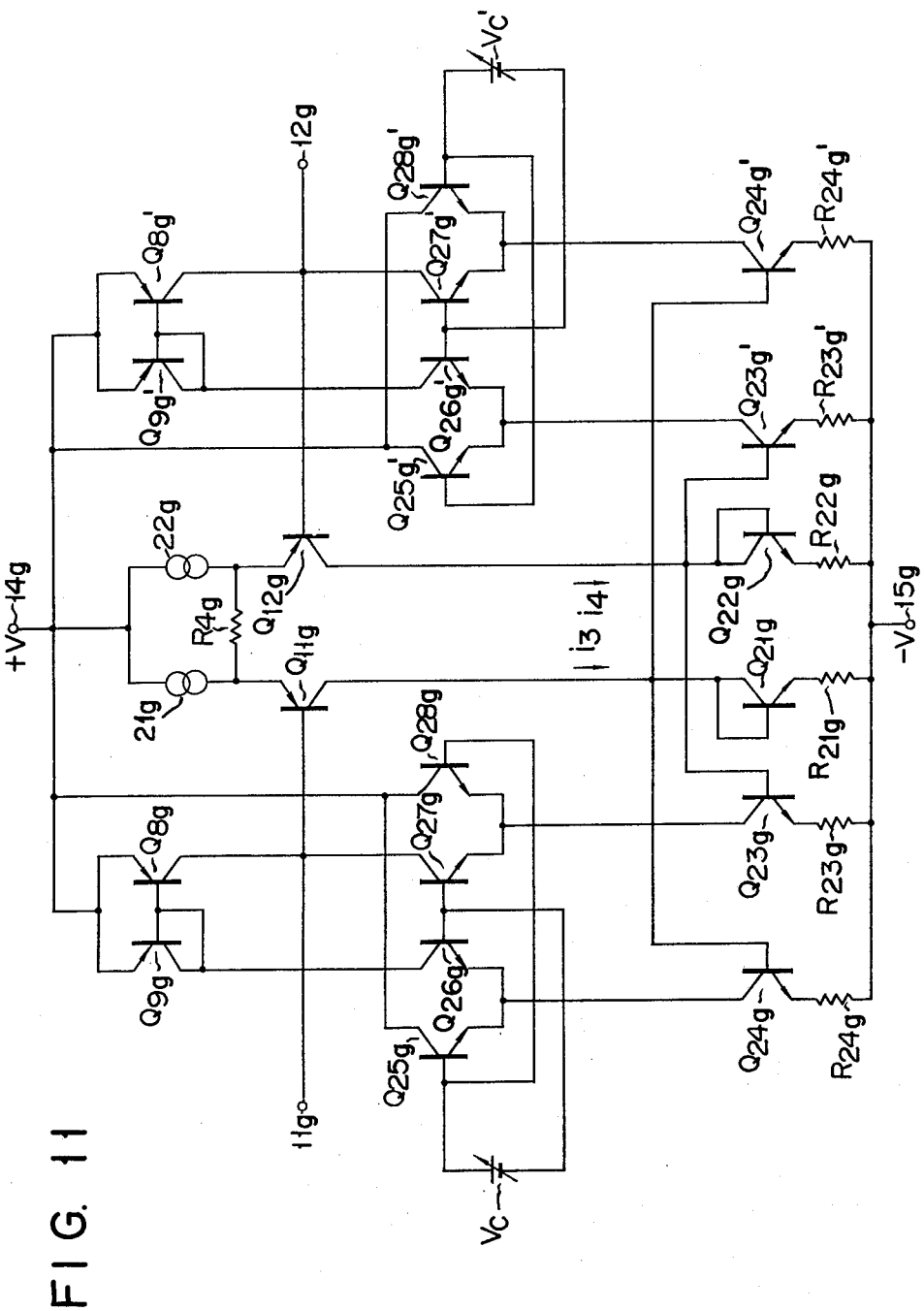
FIG. 11 shows a variable impedance circuit according to an eighth embodiment of the invention.

FIG. 11 shows a further embodiment of the invention, which is provided with two transistor pairs for supplying currents respectively to a first current divider circuit formed of transistors Q25g to Q28g and a second current divider circuit formed of transistors Q25g' to Q28g'. More specifically, in order to amplify one output current i3 of the voltage-current converter circuit, a transistor Q24g and a resistor R24g are connected in series between the commonly connected emitters of the transistors Q25g and Q26g and the power supply terminal 15g, while a transistor Q24g' and a resistor R24g' are connected in series between the commonly connected emitters of the transistors Q27g' and Q28g' and the power supply terminal 15g.

Moreover, in order to amplify the other output current i4 of the voltage-current converter circuit, a transistor Q23g and a resistor R23g are connected in series between the commonly connected emitters of the transistors Q27g and Q28g and the power supply terminal 15g, while a transistor Q23g' and a resistor R23g' are connected in series between the common connected emitters of the transistors Q25g' and Q26g' and the power supply terminal 15g. First and second current converter circuits are controlled respectively with control voltages Vc and Vc', so that conductances as taken from the input terminals 11g and 12g may be varied independently.

What is claimed is:

1. An electrically variable impedance circuit comprising:
 a voltage-current converter circuit having an input terminal receiving an input voltage signal for converting said input voltage signal into an output signal, said voltage-current converter circuit including means for keeping the conversion gain of said voltage-current converter circuit unchanged;
 a current converter circuit having an output coupled to said input terminal of said voltage-current converter circuit, said current converter circuit including a PN junction connected to receive said output current signal of said voltage-current converter circuit to develop a voltage signal which is a logarithm of said output current signal of said voltage-current converter circuit, and a transistor across whose base and emitter terminals is applied said voltage developed by said PN junction to produce a current signal which is an exponential of said voltage developed by said PN junction, thereby to effect a linear conversion between said output current signal of said voltage-current converter and said current signal produced by said transistor; and
 means for controlling the ratio between magnitudes of said output current signal of said voltage-current converter and said current signal produced by said transistor.

2. An electrically variable impedance circuit comprising:
 a voltage-current converter circuit having first and second input terminals the impedance between which is to be controlled and first and second output terminals for respectively supplying said first and second output terminals with first and second output currents which vary in opposite directions with respect to a reference current in response to input signal potentials at said first and second input terminals, a varying component of each of the first and second output currents being linearly proportional to a difference between the input signal potentials at said first and second input erminals;
 a current converter circuit having third and fourth input terminals respectively connected to said first and second output terminals of said voltage-current converter circuit and third and fourth output terminals for supplying said third and fourth output terminals with third and fourth output currents, respectively, which are linearly proportional to the first and second output currents, respectively, at least one output terminal of said current converter circuit being coupled to one of said first and second input terminals of said voltage-current converter circuit so that a current proportional to a difference between the third and fourth output currents of said current converter circuit is provided to said one of said first and second input terminals of said voltage-current converter circuit, said current converter circuit including first and second PN junctions respectively connected to receive the first and second output currents of said voltage-current converter circuit and develop voltages which are the logarithm of the first and second output currents, and first and second transistors each connected to receive between the base and emitter thereof the voltage developed by a corresponding one of said first and second PN junctions and produce a collector current which is the exponential of the voltage developed by said corresponding one of said first and second PN junctions; and
 impedance control means for varying the ratio between the sum of the first and second output currents of said voltage-current converter and the sum of the third and fourth output currents of said current converter circuit.

3. An electrically variable impedance circuit according to claim 2 wherein said voltage-current converter circuit comprises a pair of differential transistors having their bases connected to said first and second input terminals, respectively, resistive impedance means connected to emitters of said pair of differential transistors, and current source connected to said resistive impedance means, and said first and second PN junctions of said current converter circuit are connected to collectors of said pair of differential transistors respectively.

4. An electrically variable impedance circuit according to claim 2 wherein said voltage-current converter comprises a pair of differential transistors having their bases connected to said first and second input terminals, respectively, first and second resistive impedance means connected to emitters of said pair of differential transistors, respectively, a current source connected to said first and second resistive impedance means; and said first and second PN junctions of said current converter circuit are connected in series with said first and second resistive impedance means, respectively.

5. An electrically variable impedance circuit according to claim 2 wherein said voltage-current converter circuit comprises a pair of differential transistors having their bases connected to said first and second input terminals, respectively, and a transistor having its collector-emitter path connected in series with that of one of said pair of differential transistors which has its base connected to said input terminal of said voltage-current converter circuit that is connected to one of said third and fourth output terminals of said current converter circuit and its base connected to the other of said third and fourth output terminals of said current converter circuit.

6. An electrically variable impedance circuit according to claim 2 wherein said first and second transistors of said current converter circuit have their emitters commonly connected with each other, and said current converter circuit comprises a current source connected to said emitters of said first and second transistors, and a current mirror circuit connected to collectors of said first and second transistors, a junction between said current mirror circuit and the collector of one of said first and second transistors being connected to said one of first and second input terminals of said voltage-current converter circuit.

7. An electrically variable impedance circuit according to claim 6 wherein said current source connected to emitters of said first and second transistors is a variable current source responsive to a control voltage signal.

8. An electrically variable impedance circuit according to claim 2 wherein said first and second transistors of said current converter circuit have their emitters connected commonly with each other, and said current converter circuit further comprises a first current source connected to said emitters of said first and second transistors, and a second current source connected with a collector of one of said first and second transistors, a junction between said second current source and said one of said first and second transistors being connected to one of said first and second input terminals of said voltage-current converter circuit.

9. An electrically varaible impedance circuit according to claim 8 wherein said first and second current sources are varaible current sources responsive to a control voltage signal.

10. An electrically variable impedance circuit comprising:

a voltage-current converter circuit having first and second input terminals the impedance between which is to be controlled and first and second output terminals for respectively supplying said first and second output terminals with first and second output currents which vary in opposite directions with respect to a reference current in response to input signal potentials at said first and second input terminals, a varying conponent of each of the first and second output currents being linearly proportional to a difference between the input signal potentials at said first and second input terminals; and a current converter circuit including a current amplifier circuit for amplifying the first and second output currents of said voltage-current converter circuit by the same factor to produce third and fourth output currents, a current divider circuit connected to receive the third and fourth output currents of said current amplifier circuit for dividing the third and fourth output currents by the same factor to produce fifth and sixth output currents; and a current mirror circuit connected to receive the fifth and six output currents of said current divider circuit, a junction between said current mirror circuit and said current divider circuit being connected to one of said first and second input terminals of said voltage-current converter, and said current divider circuit including first and second pairs of differential transistors having commonly connected emitters and connected to receive the fifth and sixth output currents of said current amplifier circuit at the respective commonly connected emitters and the bases of said differential transistors of each pair being connected to receive a control voltage signal therebetween whereby collector currents of said differential transistors of each pair have a ratio therebetween dependent on the magnitude of the control voltage signal.

* * * * *